(12) United States Patent
Pernyeszi

(10) Patent No.: US 8,324,684 B1
(45) Date of Patent: Dec. 4, 2012

(54) MONOLITHIC HIGH-CURRENT AND LOW-CURRENT TRANSISTORS SHARING HIGH VOLTAGE DRAIN

(75) Inventor: Joseph Pernyeszi, Scotts Valley, CA (US)

(73) Assignee: General Microelectronics Corporation, Santa Clara, CA (US)

( * ) Notice: Subject to any disclaimer, the term of this patent is extended or adjusted under 35 U.S.C. 154(b) by 121 days.

(21) Appl. No.: 13/080,485

(22) Filed: Apr. 5, 2011

(51) Int. Cl.
*H01L 29/66* (2006.01)

(52) U.S. Cl. .................................................. 257/337

(58) Field of Classification Search .............. 257/337
See application file for complete search history.

(56) References Cited

U.S. PATENT DOCUMENTS 7,166,893 B2 * 1/2007 Taniguchi et al. ........... 257/336

* cited by examiner

*Primary Examiner* — Calvin Lee
*Assistant Examiner* — Monica D Harrison
(74) *Attorney, Agent, or Firm* — Kilpatrick Townsend & Stockton LLP

(57) ABSTRACT

A planar, monolithic, high-voltage (HV), integrated circuit (IC) includes power field-effect-transistors (FETs) and/or bipolar power-transistors having an HV diffusion connection. The HV IC further includes several types of HV, low-current (LC) FETs including depletion and/or enhancement mode transistors and/or HV-LC bipolar transistors. The HV-LC transistors are integrated into the HV-high-current (HC) or power transistor structure in various combinations by sharing their HV diffusion connections, which enables increased design versatility while minimizing die area. Isolation and buried diffusion structures provide higher operating voltage and/or enhanced depletion FET shut-off. HV-LC IGFET body and/or bipolar transistor base regions are either isolated from or connected to the grounded isolation diffusion further enhancing design versatility.

52 Claims, 9 Drawing Sheets

MONOLITHIC HIGH-CURRENT AND LOW-CURRENT TRANSISTORS SHARING HIGH VOLTAGE DRAIN

CROSS-REFERENCES TO RELATED APPLICATIONS

This application is related to commonly assigned U.S. patent application Ser. No. 09/493,955, filed Jan. 28, 2000, titled "SEMICONDUCTOR WITH HIGH-VOLTAGE COMPONENTS AND LOW-VOLTAGE COMPONENTS ON A SHARED DIE", U.S. Pat. No. 6,236,100, the contents of all of which are incorporated herein by reference in their entirety.

BACKGROUND

The present invention relates generally to integrated circuits (ICs). More specifically, some embodiments of the present invention relate to a planar, monolithic, high-voltage (HV) IC having power field-effect-transistors (FETs) and/or bipolar power transistors having an HV diffusion connection.

In some applications, HV ICs typically include both HV and low-voltage (LV) transistors on a single monolithic die. HV transistors have larger dimensions than LV transistors in order to withstand the applied HV. This applies to HV transistors irrespective of whether they carry high-current (HC) or if they carry low-current (LC). Otherwise, HV transistors may have problems, such as junction or material breakdown, which causes uncontrolled currents to flow in the die. Such uncontrolled currents may lead to poor reliability or even catastrophic failure. Higher die area due to the inclusion of multiple, large HV-transistors drives higher die cost and lower yield. AN HV-LC transistor, although smaller in width than a HV-HC transistor (sometimes referred to as a "power transistor"), still takes up relatively large die area for the dimensions required for the HV diffusion if designed as a conventional stand-alone transistor. Consequently, there are usually fewer HV than LV transistors, and sometimes just one HV transistor, on the IC.

In a sub-group of these applications HV is supplied to a die through a HV-HC bipolar transistor or an HV-HC FET using an open collector or open drain configuration, respectively. Thus, the HV may be isolated to the particular large-area diffusion structure in a HV-HC transistor. LV may be supplied to a die through an additional external-supply. More desirably, to reduce overall system cost and complexity, LV may be supplied to the die by an on-chip, regulated, LV supply circuit drawing power for the entire IC through the power transistor from a singe external HV supply. Capabilities of such on-chip, regulated, LV supplies depend on circuits having HV-LC transistors in addition to the HV-HC, power transistor.

In such conventional HV ICs, providing an on-chip, regulated LV supply, which requires both HV-HC and HV-LC transistors, comes at the expense of relatively large die area, large cost, and low yield. Therefore, there is a need for new HV ICs that take up less die area while enabling circuits having multiple HV transistors.

BRIEF SUMMARY

The present invention relates generally to integrated circuits (ICs). More specifically, some embodiments of the present invention relate to a planar, monolithic, high-voltage (HV) IC having power field-effect-transistors (FETs) and/or bipolar power transistors having an HV diffusion connection.

According to one embodiment of the present invention, a planar, monolithic, high-voltage integrated circuit includes a semiconductor region of a first conductivity type over a semiconductor substrate of a second conductivity type. The semiconductor region forms a p-n junction with the semiconductor substrate. The integrated circuit further includes a first diffusion region of the first conductivity type in the semiconductor region. The semiconductor region extends vertically between the first diffusion region and the semiconductor substrate.

The planar, monolithic, high-voltage integrated circuit further includes a first field effect transistor (FET), which includes a first gate electrode and a first gate dielectric between the first gate electrode and the semiconductor region and over the semiconductor region. The first gate dielectric has a first and a second edge. The first FET further includes a first body region of the second conductivity type in the semiconductor region. The first body region: (i) overlaps a portion of the first gate dielectric at the first edge of the first gate dielectric, (ii) forms a p-n junction with the semiconductor region, and (iii) has an edge under the first gate dielectric. The first FET further includes a second diffusion region of the first conductivity type in the first body region. The second diffusion region: (i) overlaps a portion of the first gate dielectric at the first edge of the first gate dielectric, (ii) forms a p-n junction with the first body region, and (iii) has an edge under the first gate dielectric. The first gate overlaps the second diffusion region less than the first gate overlaps the first body region. A first channel region is formed in the first body region under the first gate dielectric and between the edge of the second diffusion region and the edge of the first body region. The first gate dielectric overlaps the semiconductor region at the second edge of the first gate dielectric. A portion of the semiconductor region between the first channel region and the first diffusion region is a drift region. The first diffusion region is laterally spaced apart from the first channel region and is configured to receive a high voltage.

The planar, monolithic, high-voltage integrated circuit further includes a second FET, which includes a second gate electrode and a second gate dielectric, which is between the second gate electrode and the semiconductor region and over the semiconductor region. The second gate dielectric has a first and a second edge. The second FET further includes a third diffusion region of the first conductivity type in the semiconductor region. The third diffusion region is proximal to the first edge of the second gate dielectric. The second gate dielectric: (i) is laterally disposed between the first and the third diffusion regions, (ii) is over a second channel region of the second FET, and (iii) overlaps the semiconductor region at the second edge of the second gate dielectric. A portion of the semiconductor region between the second channel region and the first diffusion region is a drift region. The first diffusion region is laterally spaced apart from the second channel region and is configured to receive the high voltage.

According to one specific embodiment, the second FET further includes a fourth diffusion region of the second conductivity type in the semiconductor region. The fourth diffusion region: (i) forms a p-n junction with the semiconductor region, (ii) overlaps a portion of the second gate dielectric at the first edge of the second gate dielectric, and (iii) is laterally disposed between the second gate dielectric and the third diffusion region. A portion of the semiconductor region between the fourth diffusion region and the substrate is a third channel region. The fourth diffusion region is laterally spaced apart from the third diffusion region and configured to receive an operating voltage less than the high voltage. The third channel region of the second FET is adapted to deplete if the operating voltage is applied.

According to another specific embodiment, the second FET further includes a second body region of the second conductivity type in the semiconductor region. The second body region: (i) overlaps a portion of the second gate dielectric at the first edge of the second gate dielectric, (ii) forms a p-n junction with the semiconductor region, and (iii) has an edge under the second gate dielectric. The third diffusion region: (i) is in the second body region, (ii) overlaps a portion of the second gate dielectric at the first edge of the second gate dielectric, (iii) forms a p-n junction with the second body region, and (iv) has an edge under the second gate dielectric. The second gate dielectric overlap of the third diffusion region is less than the second gate dielectric overlap of the second body region. The second channel region of the second FET is the second body region under the second gate dielectric and between the edge of the third diffusion region and the edge of the second body region.

According to another specific embodiment, the planar, monolithic, high-voltage integrated circuit further includes an extended diffusion region of a first conductivity type in the semiconductor substrate. The extended diffusion region forms a p-n junction with the semiconductor substrate and has a lateral extent wider than a lateral extent of the first diffusion region.

According to another specific embodiment, the planar, monolithic, high-voltage integrated circuit further includes a buried diffusion region of the second conductivity type in the semiconductor substrate. The buried diffusion region forms a p-n junction with the semiconductor region. The doping concentration of the buried diffusion region is higher than the doping concentration of the semiconductor substrate. The integrated circuit further includes an isolation diffusion region of the second conductivity type in the semiconductor region and extends from a top surface of the semiconductor region into the buried diffusion region. The isolation diffusion region forms a p-n junction with the semiconductor region. The buried diffusion region and the isolation diffusion region form a lateral annulus that isolates the first FET, the second FET, and the first diffusion region from other devices on the integrated circuit.

According to another specific embodiment, the fourth diffusion region is electrically coupled to the second gate electrode. According to another specific embodiment, the planar, monolithic, high-voltage integrated circuit further includes a buried diffusion region of the first conductivity type in the semiconductor substrate below the second FET. The buried diffusion region forms a p-n junction with the semiconductor substrate, and the doping concentration of the buried diffusion region is higher than the doping concentration of the semiconductor region.

According to another specific embodiment, the isolation diffusion region overlaps the first body region of the first FET. According to another specific embodiment, the first body region of the first FET is laterally spaced apart from the isolation diffusion region and configured to receive an operating voltage less than the high voltage. According to another specific embodiment, the buried diffusion region forms a lateral annulus below the second FET. According to another specific embodiment, the isolation diffusion region overlaps the second body region of the second FET. According to another specific embodiment, the second body region of the second FET is laterally spaced apart from the isolation diffusion region and configured to receive an operating voltage less than the high voltage.

According to one embodiment of the present invention, a method of forming a planar, monolithic, high-voltage integrated circuit to save area on a die includes the following steps. A semiconductor region of a first conductivity type is formed over a semiconductor substrate of a second conductivity type. The semiconductor region forms a p-n junction with the semiconductor substrate. A first diffusion region of the first conductivity type is formed in the semiconductor region. The semiconductor region extends vertically between the first diffusion region and the semiconductor substrate.

The method of forming the planar, monolithic, high-voltage integrated circuit further includes forming a first FET, which includes the following steps. A first gate electrode is formed. A first gate dielectric is formed between the first gate electrode and the semiconductor region and over the semiconductor region. The first gate dielectric has a first and a second edge. A first body region of the second conductivity type is formed in the semiconductor region. The first body region: (i) overlaps a portion of the first gate dielectric at the first edge of the first gate dielectric, (ii) forms a p-n junction with the semiconductor region, and (iii) has an edge under the first gate dielectric. A second diffusion region of the first conductivity type is formed in the first body region. The second diffusion region: (i) overlaps a portion of the first gate dielectric at the first edge of the first gate dielectric, (ii) forms a p-n junction with the first body region, and (iii) has an edge under the first gate dielectric. The first gate overlaps the second diffusion region less than the first gate overlaps the first body region. The first body region under the first gate dielectric and between the edge of the second diffusion region and the edge of the first body region is a first channel region. The first gate dielectric overlaps the semiconductor region at the second edge of the first gate dielectric. A portion of the semiconductor region between the first channel region and the first diffusion region is a drift region. The first diffusion region is laterally spaced apart from the first channel region and is configured to receive a high voltage.

The method of forming the planar, monolithic, high-voltage integrated circuit further includes forming a second FET, which includes the following steps. A second gate electrode is formed. A second gate dielectric is formed between the second gate electrode and the semiconductor region and over the semiconductor region. The second gate dielectric has a first and a second edge. A third diffusion region of the first conductivity type is formed in the semiconductor region. The third diffusion region is proximal to the first edge of the second gate dielectric. The second gate dielectric: (i) is laterally disposed between the first and the third diffusion regions, (ii) is over a second channel region of the second FET, and (iii) overlaps the semiconductor region at the second edge of the second gate dielectric. A portion of the semiconductor region between the second channel region and the first diffusion region is a drift region. The first diffusion region is laterally spaced apart from the second channel region and is configured to receive the high voltage.

According to one specific embodiment, the steps of forming the second FET further include forming a fourth diffusion region of the second conductivity type in the semiconductor region. The fourth diffusion region: (i) forms a p-n junction with the semiconductor region, (ii) overlaps a portion of the second gate dielectric at the first edge of the second gate dielectric, and (iii) is laterally disposed between the second gate dielectric and the third diffusion region. A portion of the semiconductor region between the fourth diffusion region and the substrate is a third channel region. The fourth diffusion region is laterally spaced apart from the third diffusion region and configured to receive an operating voltage less than the high voltage. The third channel region of the second FET is adapted to deplete if the operating voltage is applied.

According to another specific embodiment, the steps of forming the second FET further include forming a second body region of the second conductivity type in the semiconductor region. The second body region: (i) overlaps a portion of the second gate dielectric at the first edge of the second gate dielectric, (ii) forms a p-n junction with the semiconductor region, and (iii) has an edge under the second gate dielectric. The third diffusion region: (i) is in the second body region, (ii) overlaps a portion of the second gate dielectric at the first edge of the second gate dielectric, (iii) forms a p-n junction with the second body region, and (iv) has an edge under the second gate dielectric. The second gate dielectric overlap of the third diffusion region is less than the second gate dielectric overlap of the second body region. The second body region under the second gate dielectric and between the edge of the third diffusion region and the edge of the second body region is the second channel region of the second FET.

According to another specific embodiment, the method further includes forming an extended diffusion region of the first conductivity type in the semiconductor substrate. The extended diffusion region forms a p-n junction with the semiconductor substrate and has a lateral extent wider than a lateral extent of the first diffusion region.

According to another specific embodiment, the method further includes forming a buried diffusion region of the second conductivity type in the semiconductor substrate. The buried diffusion region forms a p-n junction with the semiconductor region. The doping concentration of the buried diffusion region is higher than the doping concentration of the semiconductor substrate. Forming an isolation diffusion region of the second conductivity type in the semiconductor region and extending from a top surface of the semiconductor region into the buried diffusion region. The isolation diffusion region forms a p-n junction with the semiconductor region. The buried diffusion region and the isolation diffusion region form a lateral annulus that isolates the first FET, the second FET, and the first diffusion region from other devices on the integrated circuit. According to another specific embodiment, the method further includes coupling the fourth diffusion region electrically to the second gate electrode.

According to another specific embodiment, the method further includes forming a buried diffusion region of the first conductivity type in the semiconductor substrate below the second FET. The buried diffusion region forms a p-n junction with the semiconductor substrate, and the doping concentration of the buried diffusion region is higher than the doping concentration of the semiconductor region.

According to another specific embodiment, the method further includes forming the isolation diffusion region to overlap the first body region of the first FET. According to another specific embodiment, the method further includes forming the first body region of the first FET to be laterally spaced apart from the isolation diffusion region and configured to receive an operating voltage less than the high voltage. According to another specific embodiment, the method further includes forming the buried diffusion region as a lateral annulus below the second FET. According to another specific embodiment, the method further includes overlapping the isolation diffusion region with the second body region of the second FET. According to another specific embodiment, the method further includes forming the second body region of the second FET to be laterally spaced apart from the isolation diffusion region and configured to receive an operating voltage less than the high voltage.

According to one embodiment of the present invention, a planar, monolithic, high-voltage integrated circuit includes a semiconductor region of a first conductivity type over a semiconductor substrate of a second conductivity type. The semiconductor region forms a p-n junction with the semiconductor substrate. The integrated circuit further includes a first diffusion region of the first conductivity type in the semiconductor region. The semiconductor region extends vertically between the first diffusion region and the semiconductor substrate.

The planar, monolithic, high-voltage integrated circuit further includes a bipolar transistor, which includes a base region of the second conductivity type in the semiconductor region. The base region forms a p-n junction with the semiconductor region. The bipolar transistor further includes a second diffusion region of the first conductivity type in the base region and. The second diffusion region forms a p-n junction with the base region. A portion of the semiconductor region between the base region and the first diffusion region is a drift region. The first diffusion region is laterally spaced apart from the base region and is configured to receive a high voltage.

The planar, monolithic, high-voltage integrated circuit further includes a FET, which includes a gate electrode and a gate dielectric, which is between the gate electrode and the semiconductor region and over the semiconductor region. The gate dielectric has a first and a second edge. The FET further includes a third diffusion region of the first conductivity type in the semiconductor region. The third diffusion region is proximal to the first edge of the gate dielectric. The gate dielectric: (i) is laterally disposed between the first and the third diffusion regions, (ii) is over a first channel region of the FET, and (iii) overlaps the semiconductor region at the second edge of the gate dielectric. A portion of the semiconductor region between the first channel region and the first diffusion region is a drift region. The first diffusion region is laterally spaced apart from the first channel region and is configured to receive the high voltage.

According to one specific embodiment, the FET further includes a fourth diffusion region of the second conductivity type in the semiconductor region. The fourth diffusion region: (i) forms a p-n junction with the semiconductor region, (ii) overlaps a portion of the gate dielectric at the first edge of the gate dielectric, and (iii) is laterally disposed between the gate dielectric and the third diffusion region. A portion of the semiconductor region between the fourth diffusion region and the substrate is a second channel region. The fourth diffusion region is laterally spaced apart from the third diffusion region and configured to receive an operating voltage less than the high voltage. The second channel region of the FET is adapted to deplete if the operating voltage is applied.

According to another specific embodiment, the FET further includes a second body region of the second conductivity type in the semiconductor region. The second body region: (i) overlaps a portion of the gate dielectric at the first edge of the gate dielectric, (ii) forms a p-n junction with the semiconductor region, and (iii) has an edge under the gate dielectric. The third diffusion region: (i) is in the second body region, (ii) overlaps a portion of the gate dielectric at the first edge of the gate dielectric, (iii) forms a p-n junction with the second body region, and (iv) has an edge under the gate dielectric. The gate dielectric overlap of the third diffusion region is less than the gate dielectric overlap of the second body region. The second body region under the gate dielectric and between the edge of the third diffusion region and the edge of the second body region is the first channel region of the FET.

According to another specific embodiment, the planar, monolithic, high-voltage integrated circuit further includes an extended diffusion region of a first conductivity type in the semiconductor substrate. The extended diffusion region forms a p-n junction with the semiconductor substrate and has a lateral extent wider than a lateral extent of the first diffusion region.

According to another specific embodiment, the planar, monolithic, high-voltage integrated circuit further includes a buried diffusion region of the second conductivity type in the semiconductor substrate. The buried diffusion region forms a p-n junction with the semiconductor region. The doping concentration of the buried diffusion region is higher than the doping concentration of the semiconductor substrate. The integrated circuit further includes an isolation diffusion region of the second conductivity type in the semiconductor region and extends from a top surface of the semiconductor region into the buried diffusion region. The isolation diffusion region forms a p-n junction with the semiconductor region. The buried diffusion region and the isolation diffusion region form a lateral annulus that isolates the bipolar transistor, the FET, and the first diffusion region from other devices on the integrated circuit.

According to another specific embodiment, the fourth diffusion region is electrically coupled to the gate electrode. According to another specific embodiment, the planar, monolithic, high-voltage integrated circuit further includes a buried diffusion region of the first conductivity type in the semiconductor substrate and below the FET. The buried diffusion region forms a p-n junction with the semiconductor substrate, and the doping concentration of the buried diffusion region is higher than the doping concentration of the semiconductor region.

According to another specific embodiment, the isolation diffusion region overlaps the base region of the bipolar transistor. According to another specific embodiment, the base region of the bipolar transistor is laterally spaced apart from the isolation diffusion region and configured to receive an operating voltage less than the high voltage. According to another specific embodiment, the buried diffusion region forms a lateral annulus below the FET. According to another specific embodiment, the isolation diffusion region overlaps the second body region of the FET. According to another specific embodiment, the second body region of the FET is laterally spaced apart from the isolation diffusion region and configured to receive an operating voltage less than the high voltage.

According to one embodiment of the present invention, a method of forming a planar, monolithic, high-voltage integrated circuit to save area on a die includes the following steps. A semiconductor region of a first conductivity type is formed over a semiconductor substrate of a second conductivity type. The semiconductor region forms a p-n junction with the semiconductor substrate. A first diffusion region of the first conductivity type is formed in the semiconductor region. The semiconductor region extends vertically between the first diffusion region and the semiconductor substrate.

The method of forming an planar, monolithic, high-voltage integrated circuit further includes forming a bipolar transistor, which includes the following steps. A base region of the second conductivity type is formed in the semiconductor region. The base region forms a p-n junction with the semiconductor region. A second diffusion region of the first conductivity type is formed in the base region. The second diffusion region forms a p-n junction with the base region. A portion of the semiconductor region between the base region and the first diffusion region is a drift region. The first diffusion region is laterally spaced apart from the base region and is configured to receive a high voltage.

The method of forming an planar, monolithic, high-voltage integrated circuit further includes forming a FET, which includes the following steps. A gate electrode is formed. A gate dielectric is formed between the gate electrode and the semiconductor region and over the semiconductor region. The gate dielectric has a first and a second edge. A third diffusion region of the first conductivity type is formed in the semiconductor region. The third diffusion region is proximal to the first edge of the gate dielectric. The gate dielectric: (i) is laterally disposed between the first and the third diffusion regions, (ii) is over a first channel region of the FET, and (iii) overlaps the semiconductor region at the second edge of the gate dielectric. A portion of the semiconductor region between the first channel region and the first diffusion region is a drift region. The first diffusion region is laterally spaced apart from the first channel region and is configured to receive the high voltage.

According to one specific embodiment, the steps of forming the FET further include forming a fourth diffusion region of the second conductivity type in the semiconductor region. The fourth diffusion region: (i) forms a p-n junction with the semiconductor region, (ii) overlaps a portion of the gate dielectric at the first edge of the gate dielectric, and (iii) is laterally disposed between the gate dielectric and the third diffusion region. A portion of the semiconductor region between the fourth diffusion region and the substrate is a second channel region. The fourth diffusion region is laterally spaced apart from the third diffusion region and configured to receive an operating voltage less than the high voltage. The second channel region of the FET is adapted to deplete if the operating voltage is applied.

According to another specific embodiment, the steps of forming the FET further include forming a second body region of the second conductivity type in the semiconductor region. The second body region: (i) overlaps a portion of the gate dielectric at the first edge of the gate dielectric, (ii) forms a p-n junction with the semiconductor region, and (iii) has an edge under the gate dielectric. The third diffusion region is: (i) in the second body region, (ii) overlaps a portion of the gate dielectric at the first edge of the gate dielectric, (iii) forms a p-n junction with the second body region, and (iv) has an edge under the gate dielectric. The gate dielectric overlap of the third diffusion region is less than the gate dielectric overlap of the second body region. The second body region under the gate dielectric and between the edge of the third diffusion region and the edge of the second body region is the first channel region of the FET.

According to another specific embodiment, the method further includes forming an extended diffusion region of the first conductivity type in the semiconductor substrate. The extended diffusion region forms a p-n junction with the semiconductor substrate and has a lateral extent wider than a lateral extent of the first diffusion region.

According to another specific embodiment, the method further includes forming a buried diffusion region of the second conductivity type in the semiconductor substrate. The buried diffusion region forms a p-n junction with the semiconductor region and the doping concentration of the buried diffusion region is higher than the doping concentration of the semiconductor substrate. Forming an isolation diffusion region of the second conductivity type in the semiconductor region and extending from a top surface of the semiconductor region into the buried diffusion region. The isolation diffusion region forms a p-n junction with the semiconductor region. The buried diffusion region and the isolation diffusion region form a lateral annulus that isolates the bipolar transistor, the FET, and the first diffusion region from other devices on the integrated circuit.

According to another specific embodiment, the method further includes coupling the fourth diffusion region electrically to the gate electrode. According to another specific embodiment, the method further includes forming a buried diffusion region of the first conductivity type in the semiconductor substrate and below the FET. The buried diffusion region forms a p-n junction with the semiconductor substrate, and the doping concentration of the buried diffusion region is higher than the doping concentration of the semiconductor region.

According to another specific embodiment, the method further includes forming the base region of the bipolar transistor to be laterally spaced apart from the isolation diffusion region and configured to receive an operating voltage less than the high voltage. According to another specific embodiment, the method further includes forming the buried diffusion region as a lateral annulus below the FET. According to another specific embodiment, the method further includes overlapping the isolation diffusion region with the second body region of the FET. According to another specific embodiment, the method further includes forming the second body region of the FET to be laterally spaced apart from the isolation diffusion region and configured to receive an operating voltage less than the high voltage.

A better understanding of the nature and advantages of the embodiments of the present invention may be gained with reference to the following detailed description and the accompanying drawings.

DETAILED DESCRIPTION

According to the embodiments of the present invention, several types of HV-LC FETs and/or HV-LC bipolar transistors are described that provide increased design versatility while minimizing system costs by consuming relatively less die area on a planar, monolithic, HV IC as compared to traditional HV ICs. More particularly, the HV-LC FETs and/or HV-LC bipolar transistors are integrated into an HV-HC transistor (alternatively referred to herein as "power transistor"). This integration is provided by sharing the HV diffusion region of the power transistor with the HV diffusion region of the HV-LC FETs and/or the HV-LC bipolar transistor. Sharing the HV diffusion of the power transistor with the HV diffusion of the HV-LC transistor consumes less die area than a stand-alone HV-LC transistor. Thus, an HV-LC transistor, designed according to the embodiments described below, may extract current from a power transistor using less die area than conventional designs. The HV-LC FETs include depletion and/or enhancement mode transistors. Therefore more HV-LC transistors may be integrated on the HV IC at lower cost, with better yield, and/or providing more design versatility than was previously possible.

Figure 1:
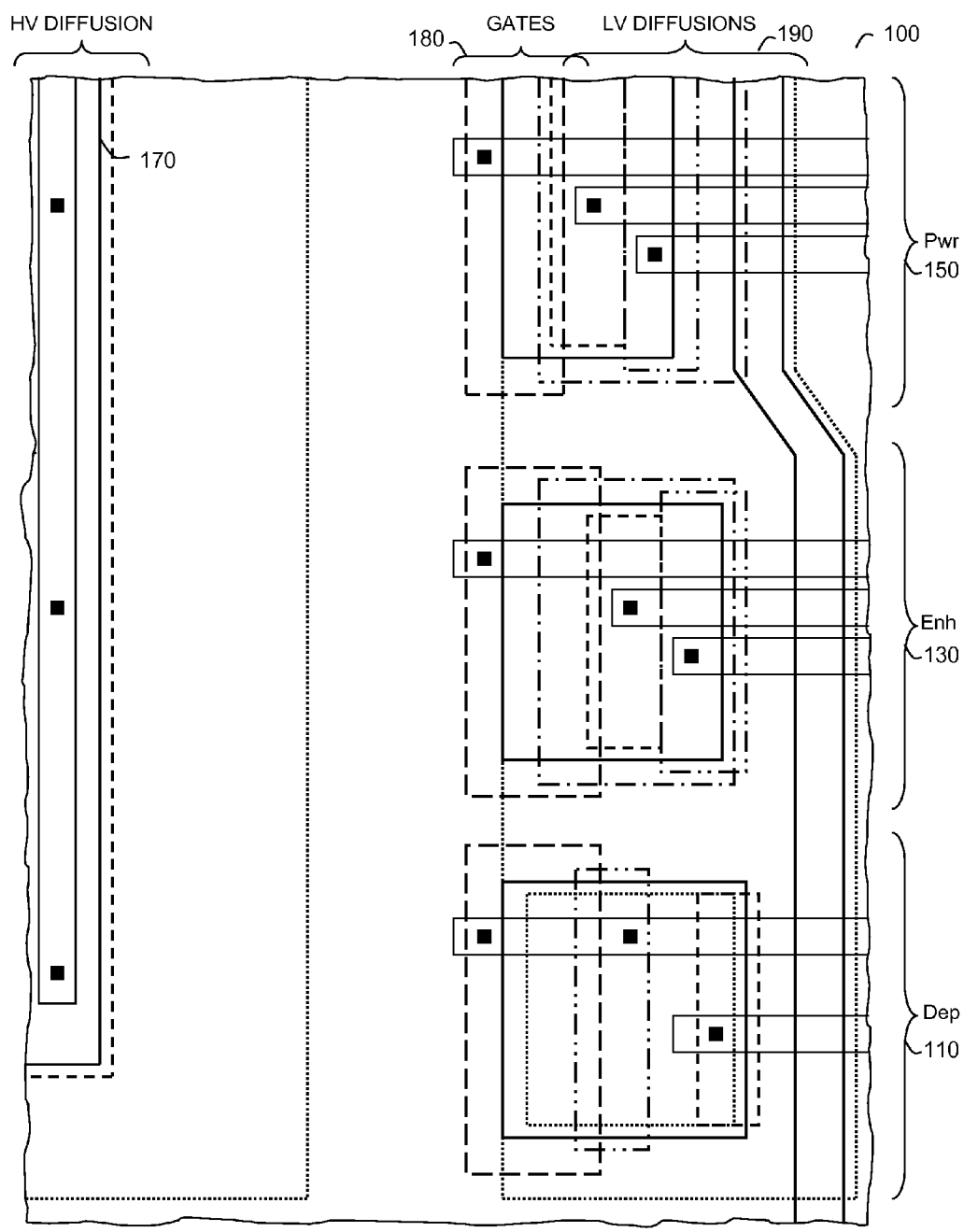
FIG. 1 is a simplified top view showing an exemplary portion of an HV IC having an HV-LC depletion FET, an HV-LC enhancement insulated gate FET (IGFET) and a power IGFET in accordance with an embodiment of the present invention.

FIG. 1 is a simplified top view of an exemplary portion of an HV IC 100 having an HV-LC depletion FET 110, an HV-LC enhancement IGFET 130, and a power IGFET 150 in accordance with an embodiment of the present invention. An HV diffusion region 170 at the left of FIG. 1 is shared in parallel connection with the power IGFET, the HV-LC enhancement IGFET, and the HV-LC depletion FET. The HV-LC FETs each have individual gate electrodes 180 located between the HV diffusion region and the individual LV diffusion regions 190. Embodiments of these HV FETs are described in greater detail below.

The HV diffusion region is spaced apart from the gates, the corresponding channel regions under the gates, and the LV diffusion regions. This spacing and other elements to be described below prevent excessively high electric fields in the semiconductor material. Excessively high electric fields may lead to avalanche breakdown in the semiconductor junction, which may create uncontrollable or destructively high currents. This spacing is one way the HV diffusion region is configured to receive a HV. A bottom and a right portion of the HV diffusion region is shown, it being understood by those skilled in the art that large spacing surrounds the HV diffusion region on all sides as viewed from above. This spacing explains, in part, why adding the element of the HV diffusion in a LC transistor comes with a high penalty in die area, which embodiments of the present invention address.

A lower portion of the power transistor is shown in FIG. 1, it being understood by those skilled in the art that the power transistor may extend beyond FIG. 1, wrap around the HV diffusion region at the spacing described above, and/or be repeated in segmented or interdigitated fashion to facilitate layout or improve device characteristics. The width (z-dimension characteristic) of the power transistor may be many times the width of the HV-LC transistors. Consequently, the addition of HV-LC transistors may add negligible area to an existing power transistor area using the embodiments described herein.

By way of example, FIG. 1 shows a power IGFET in combination with both an HV-LC enhancement IGFET and an HV-LC depletion FET, but it would be recognized that the embodiment has a broader range of applicability. For example, any combination of HV-LC FETs may be included in combination with the power transistor. In another example, one HV-LC FET of any of the embodiment types may be combined with the power transistor. In a different example, any combination of multiple HV-LC FETs may be included in combination with the power transistor, according to various embodiments of the invention. Similarly, the connections between the gates and the LV diffusion regions are shown by way of example and may be made in any combination, according to various embodiments of the invention. For example, some of the individual gate electrodes may be combined or may be separated. In another example, some of the individual LV diffusion regions may be combined or may be separated depending on their conductivity type or may be connected by metal, according to various embodiments of the invention.

Metal lines are shown as long, narrow lines with a solid border. Contacts between metal and semiconductor diffusion regions are shown as small squares with solid dark fill pattern. These particular, specific embodiments will not be discussed in detail except as required. The metal and contacts are omitted from the drawing cross sections to better convey the embodiments. By way of example, one metal layer has been shown but it would be understood that multiple metal layers in various connections may be included.

Figure 2A:
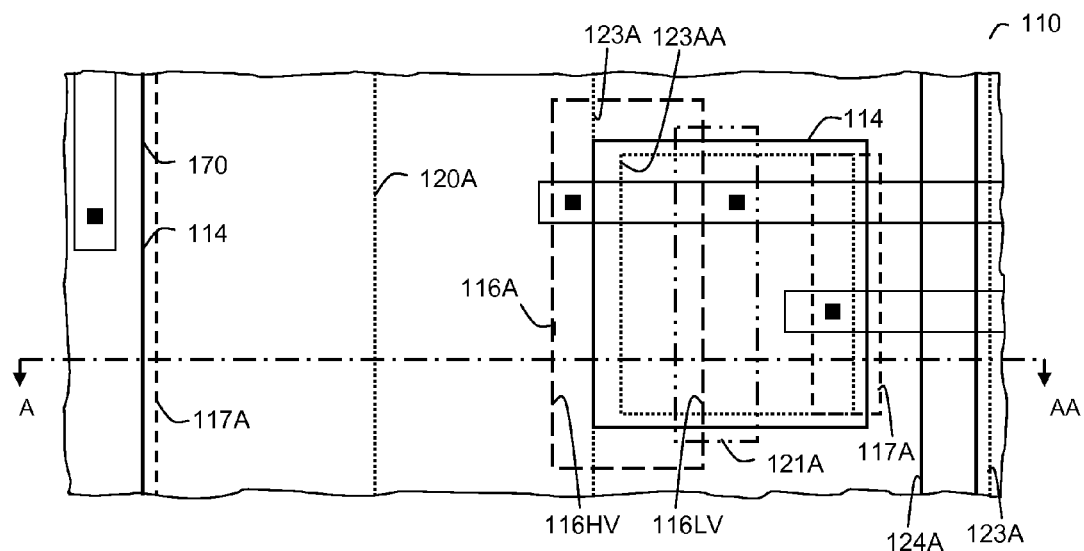
FIGS. 2A-2B are simplified top and cross-sectional views, respectively, showing an exemplary portion of an HV-LC depletion FET in accordance with an embodiment of the present invention.
Figure 2B:
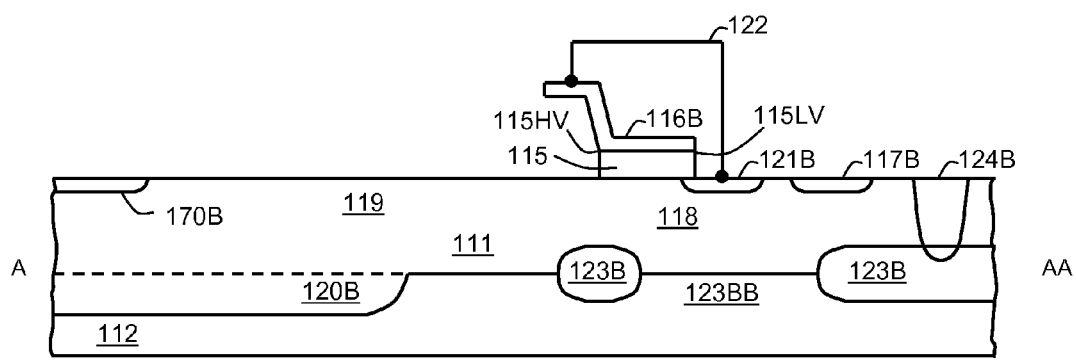

FIGS. 2A-2B are simplified top and cross-sectional views, respectively, of an exemplary portion of an HV-LC depletion FET 110 in accordance with an embodiment of the invention. FIG. 2A reproduces the HV-LC depletion FET top view as shown in FIG. 1 and includes some mask layers included to form the FET. In FIGS. 2A-2B a semiconductor region 111 of a first conductivity type is formed over a semiconductor substrate 112 of a second conductivity type, where the semiconductor region forms a p-n junction with the semiconductor substrate. Semiconductor substrate 112 may be a silicon substrate, an III-V compound substrate, a silicon/germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, or other substrates adapted for forming an HV IC, for example. The embodiment shown in FIGS. 2A-2B is an n-channel type depletion FET, and semiconductor substrate 112 may include a silicon substrate with p-type dopants such as boron or gallium and/or other group III elements. Semiconductor region 111 may include silicon with n-type dopants such as phosphorus, arsenic, and/or other group V elements.

An active mask 114 may be included to form active regions on the depletion FET including a gate dielectric 115 over the semiconductor region and surface diffusion regions in the semiconductor region. Surface isolation structures may be formed outside the active mask regions but are not shown to simplify explanation. A gate mask 116A may be included to form a gate electrode 116B. Thus, the depletion FET's gate dielectric is between the gate electrode and the semiconductor region and is substantially over the semiconductor region. A diffusion region mask 117A of the first conductivity type may be included near an edge 116LV of gate mask 116A and on the side opposite the HV diffusion region 170, to form a LV diffusion region 117B of the first conductivity type in the surface of semiconductor region 111. LV diffusion region 117B may serve as a source for the depletion FET. Diffusion region mask 117A may also be included on the opposite side of gate mask 116A to form an HV diffusion region 170B of the first conductivity type in the surface of semiconductor region 111. Thus, gate dielectric 115 of the depletion FET is laterally disposed between HV diffusion region 170B and LV diffusion region 117B. A channel region 118 is below gate dielectric 115 and in semiconductor region 111. Diffusion regions 117B and 170B may be formed during processing steps corresponding to formation of source/drain diffusions included for n-channel FETs in a CMOS process, for example. Alternatively, diffusion regions 117B and 170B may be formed during separate processing steps to optimize their characteristics.

A portion of the semiconductor region between the depletion FET's channel region 118 and HV diffusion region 170B may be called a drift region 119. Drift region 119 laterally spaces apart HV diffusion region 170B from the depletion FET's channel region 118. HV diffusion region 170B is configured to receive a high voltage because semiconductor region 111 is lightly doped and the drift region is sufficiently wide enough to prevent excessively high electric fields between the HV diffusion region and the channel region. HV diffusion region 170B may serve as a drain for the HV-LC depletion FET.

The vertical spacing between HV diffusion region 170B and the p-n junction formed by semiconductor region 111 and semiconductor substrate 112 may also be extended to prevent excessively high electric fields. An extended diffusion region mask 120A may be included to form an extended diffusion region 120B of the first conductivity type in semiconductor substrate 112. The extended diffusion region forms a p-n junction with the semiconductor substrate and has a lateral extent wider than a lateral extent of HV diffusion region 170B. In this example extended diffusion region 120B is n-type.

Since drain HV diffusion region 170B, drift region 119, channel region 118, and source LV diffusion region 117B are the same conductivity type, n-type in this example, HV-LC FET 110 may operate in a depletion mode. If an HV is applied to HV diffusion region 170B and a LV is applied to LV diffusion region 117B, current will flow in the semiconductor region responsive to the operating voltage applied to the gate electrode. In FET 110, the current is not controlled by modulating the conductance of a surface inversion channel as in the case of enhancement IGFETs. Instead, the current flows in the bulk of the semiconductor region, which serves as the channel for the depletion FET. The depletion FET is configured to receive an operating voltage on the gate electrode that is less than HV, and the channel region in the depletion FET is adapted to deplete if the operating voltage is applied. The current through the channel is controlled by pinching off the channel by forming a depletion region under the gate dielectric. For example, if the operating voltage on the gate electrode is higher than LV but less than HV, there may be little voltage developed between gate electrode 116B and channel 118 in semiconductor region 111, which results in a small depletion region, if any, below gate dielectric 115. A small depletion region over the channel 118 allows a relatively large current to flow in the channel. However, as the operating voltage on gate electrode 116B is lowered, the voltage difference between gate electrode 116B and channel 118 increases, forming or increasing the extent of the depletion region under the gate dielectric. Less current will flow as the channel is pinched off by the increased depletion region depth from the surface into the depletion FET's channel.

In some embodiments the depth and/or the lateral extent of the depletion region included to pinch off the HV-LC depletion FET channel may be increased by using a diffusion region mask 121A to form a diffusion region 121B of the second conductivity type in the surface of semiconductor region 111, thus forming a p-n junction with the semiconductor region. Diffusion region 121B may overlap a portion of gate dielectric 115 at a first edge 115LV of the gate dielectric that is on the same side of the gate dielectric as LV diffusion region 117B. Diffusion region 121B may be formed laterally between gate dielectric 121B and LV diffusion region 117B. Diffusion region 121B may be electrically coupled to the depletion FET's gate electrode 116B as indicated by the metal connection and contacts in FIG. 2A and the schematic connection 122 represented in FIG. 2B. In alternative embodiments, gate electrode 116B and diffusion region 121B may not be electrically coupled to the same voltage and instead may have separate control connections. If the operating voltage described above is applied to diffusion region 121B, the p-n junction formed with the semiconductor region may be reverse biased to form a depletion region below diffusion region 121B. The depletion region below diffusion region 121B may extend into the semiconductor region. Thus, diffusion region 121B may act in a similar fashion as the depletion FET's gate electrode and extend the length of, or add another channel region in between, the diffusion region 121B and the substrate in semiconductor region 111. Diffusion region 121B may be laterally spaced apart from diffusion region 117B and thus be configured to receive the operating voltage without creating excessively high electric fields or currents. In this example diffusion region 121B is p+ type and may correspond to the source/drain diffusion included for p-channel FETs in a CMOS process.

The channel pinch off in the HV-LC depletion FET may be assisted by the depletion region formed from below the FET's channel by the semiconductor substrate-semiconductor region p-n junction. This junction is reverse biased if HV is applied to HV diffusion region 170B and the substrate is grounded. The resulting depletion region tends to pinch the HV-LC depletion FET channel from below. The pinching effect may be enhanced by another embodiment, which is a buried diffusion region mask 123A of the second conductivity type included to form a buried diffusion region 123B in semiconductor substrate 112. Buried diffusion region 123B forms a p-n junction with semiconductor region 111 and the doping concentration of the buried diffusion region is higher than the doping concentration of the similar conduction type semiconductor substrate. Thus, the reverse bias depletion region is pushed further upwards tending to further pinch the depletion FET channel. In this example buried diffusion region 123B is p-type.

In some embodiments, a buried diffusion region 123B may be formed as a lateral annulus 123AA and 123BB below the HV-LC transistor. This enables higher operating voltages to be applied to gate electrode 116B and/or diffusion region 121B, while still providing the enhanced channel pinch off for the depletion FET discussed above. Lighter doping in the center of the annulus 123BB may prevent excessively high electric fields if the higher operating voltage is applied. The higher operating voltage increases the channel pinch off and enables the depletion FET to be shut off better.

In some embodiments, an isolation diffusion region mask 124A may be included to form isolation diffusion region 124B of the second conductivity type in the surface of semiconductor region 111 and extends from a top surface of the semiconductor region down into buried diffusion region 123B. The isolation diffusion region forms a p-n junction with semiconductor region 111. Buried diffusion region 123B and isolation diffusion region 124B may be formed as a lateral annulus that surrounds and isolates the power transistor, the HV-LC FET and HV diffusion region 170B from other devices on the integrated circuit. The deeper isolation diffusion region may be more effective at reducing leakage currents between HV and LV sections of the HV IC than the shallower surface isolation techniques such as shallow trench isolation included between active mask 114 regions. In this example, isolation diffusion region 124B is p-type.

Applications for the HV-LC depletion FET may include, for example, include in regulating an on-chip, LV-supply circuit. Another example may be providing start-up current to the HV IC, which may be shut off in stand-by operation. This is advantageous over commonly included external resistors, which may draw current continuously and whose start-up current may be constrained to reduce standby power. In contrast, the start up current using the depletion FET may be increased to provide faster system start-up while shut off during standby, thus optimizing performance.

Figure 3A:
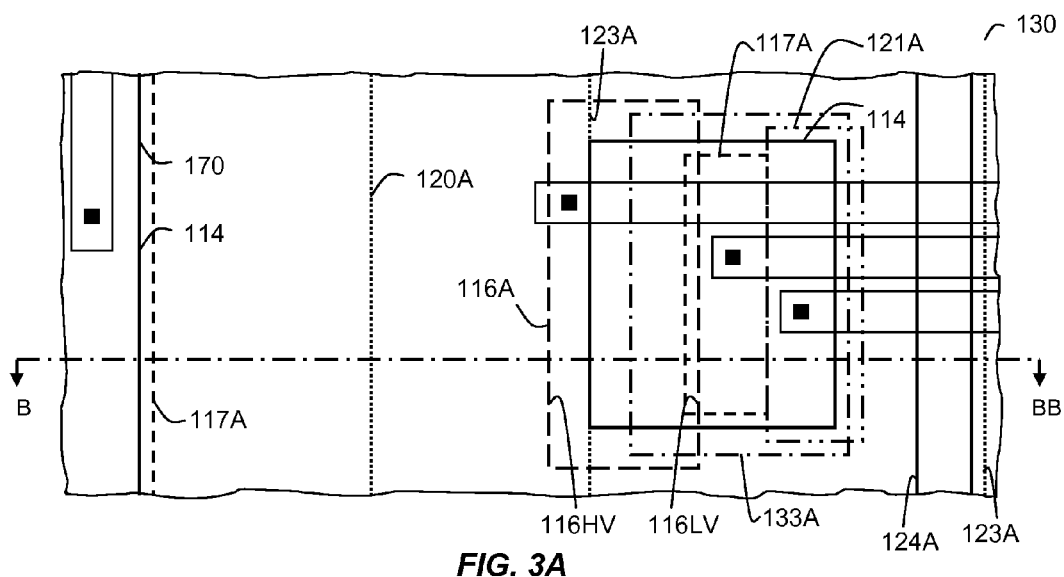
FIGS. 3A-3B are simplified top and cross-sectional views, respectively, showing an exemplary portion of an HV-LC enhancement IGFET in accordance with a first embodiment of the present invention.
Figure 3B:
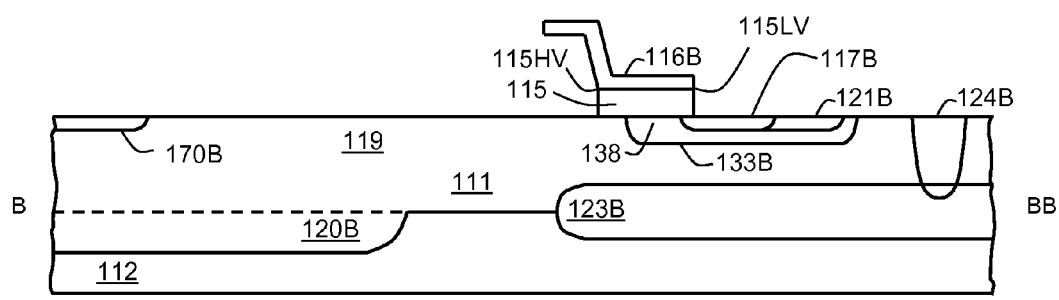

FIGS. 3A-3B are simplified top and cross-sectional views, respectively, showing an exemplary portion of an HV-LC enhancement IGFET 130 in accordance with a first embodiment of the present invention. FIG. 3A reproduces the HV-LC enhancement IGFET top view as shown in FIG. 1 and includes some mask layers included to form the FET. Many elements shown in FIGS. 3A-3B are the same elements as shown in FIGS. 2A-2B and will not be described in detail because their structures and operations are similar except as noted below. FIGS. 3A-3B include a body region mask 133A included to form body region 133B of the second conductivity type in the surface of semiconductor region 111. Body region 133B overlaps a portion of gate dielectric 115 at the first edge 115LV of the gate dielectric opposite the side with HV diffusion region 170B. The body region forms a p-n junction with the semiconductor region and has an edge under gate dielectric 115. Source LV diffusion region 117B: (i) is in the surface of body region 133B, (ii) overlaps a portion of gate dielectric 115 at first edge 115L of the gate dielectric, (iii) forms a p-n junction with body region 133B, and (iv) has an edge under the second gate dielectric. Gate dielectric 115 overlaps source LV diffusion region 117B to a lesser extent than body region 133B. The portion of body region 133B under the gate dielectric and between the edge of LV diffusion region 117B and the edge of body region 133B may be the channel region of HV-LC enhancement IGFET 130. In this example body region 133B is p-type and HV-LC enhancement IGFET 130 is an n-channel transistor with LV diffusion region 117B and HV diffusion region 170B included as n-type source and drain, respectively.

In some embodiments LV diffusion region 117B may be formed from one diffusion process step or from a plurality of diffusions of the same, first conductivity type to achieve desired characteristics, such as higher breakdown voltage or lower drain induced barrier lowering. For example, LV diffusion region 117B may be formed from a combination of a lightly doped drain (LDD) and a heavily doped drain (HDD). The LDD may overlap first edge 115LV of gate dielectric 115 and the HDD may be formed proximal the first edge of gate dielectric 115 but laterally spaced slightly away from the first edge of gate dielectric 115. Thus, the HDD may be electrically coupled to the channel region of the HV enhancement IGFET via the LDD. An alternative may include the HDD also overlapping first edge 115LV of gate dielectric 115 and the LDD overlapping first edge 115LV slightly further into the IGFET's channel than the HDD. The HDD portion of the LV diffusion region 117B may be doped high enough to form an ohmic contact.

In some embodiments buried diffusion region 123B may extend substantially underneath the HV-LC transistor to help isolate leakage currents. For example, buried diffusion region 123B may extend substantially underneath the HV-LC enhancement IGFET.

A LV diffusion region mask 121A may be included to form a LV diffusion region 121B of the second conductivity type in the surface of body region 133B. The doping concentration of LV diffusion region 121B is higher than doping concentration of the body region 133B to form an ohmic contact to the body region, which is the same conductivity type. In one embodiment, body region 133B of HV-LC enhancement IGFET 130 is laterally spaced apart from the isolation diffusion region and configured to receive an operating voltage less than the HV. Applications for this embodiment include circuits where the body of the HV-LC enhancement IGFET is not coupled to ground voltage via isolation diffusion region 124B.

Figure 4A:
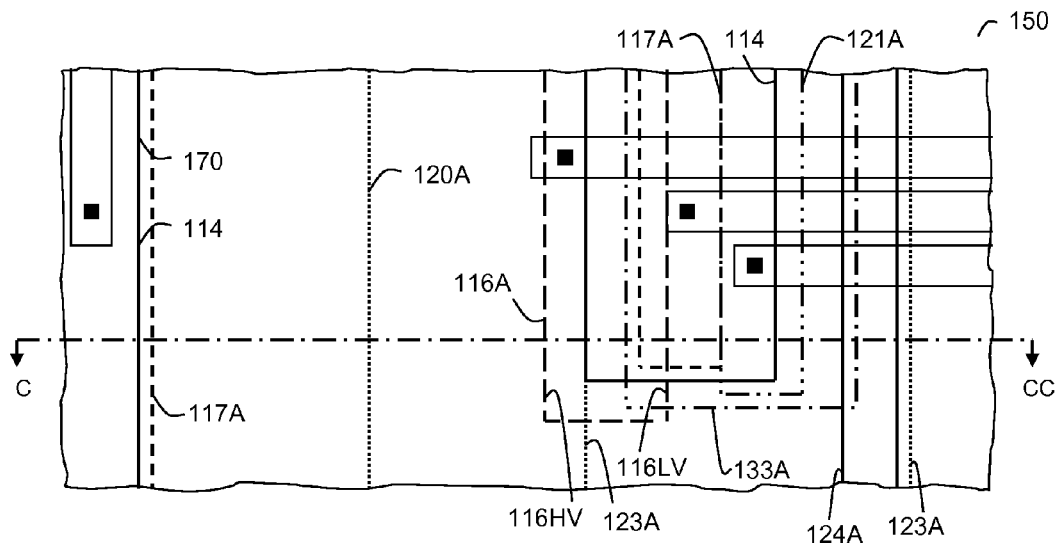
FIGS. 4A-4B are simplified top and cross-sectional views, respectively, showing an exemplary portion of a power IGFET in accordance with one embodiment of the present invention.
Figure 4B:
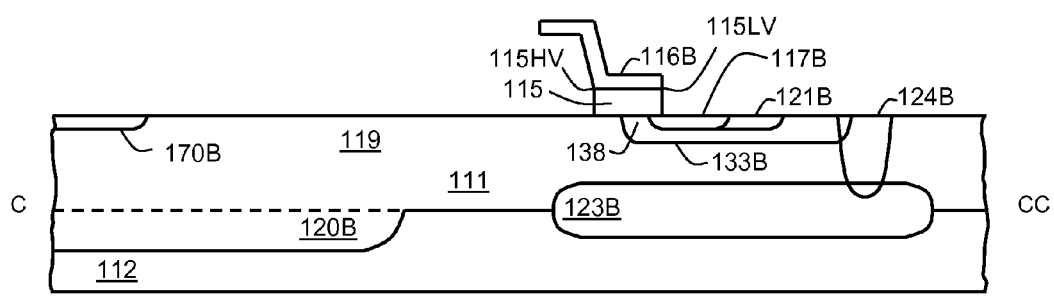

FIGS. 4A-4B are simplified top and cross-sectional views, respectively, showing an exemplary portion of a power IGFET 150 in accordance with one embodiment of the present invention. FIG. 4A reproduces the power IGFET top view as shown in FIG. 1 and includes some mask layers included to form the power IGFET. It would be understood by persons of skill in the art that the power IGFET, which is equivalently an HV-HC enhancement IGFET, may be formed into an HV-LC enhancement IGFET by reducing the channel width on the mask layout (transistor z-dimension) to obtain the desired LC transistor characteristics. Thus, elements shown in FIGS. 4A-4B may apply to both the power IGFET and to the HV-LC enhancement IGFET. Many elements shown in FIGS. 4A-4B are the same elements as shown in FIGS. 3A-3B and will not be described in detail because their structures and operations are similar except as noted below. FIGS. 4A-4B include an embodiment where isolation diffusion region 124B overlaps body region 133B of the enhancement IGFET in both HV-HC and/or HV-LC versions. The isolation diffusion region overlap of the body region couples the body region to the substrate potential, which may be grounded. Applications for this embodiment include circuits where some of the device characteristics, for example the gate threshold voltage (Vt), of the HV-LC enhancement IGFET match those of the power IGFET. Thus, the HV-LC enhancement IGFET may be included as a sensor to measure a ratio of the current drawn by the Vt matched power IGFET using a circuit such as, for example, a current mirror.

Figure 5A:
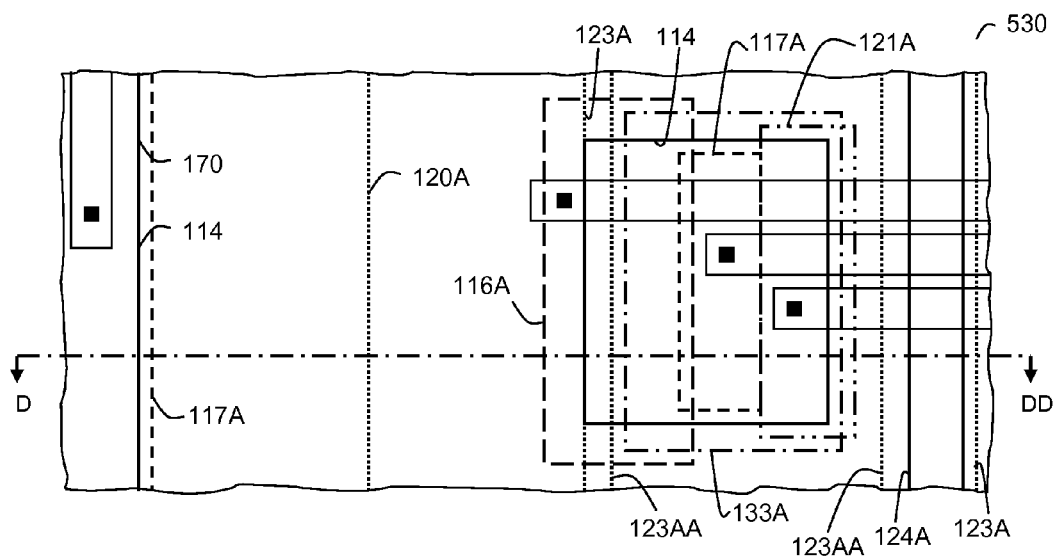
FIGS. 5A-5B are simplified top and cross-sectional views, respectively, showing an exemplary portion of an HV-LC enhancement IGFET in accordance with a second embodiment of the present invention.
Figure 5B:
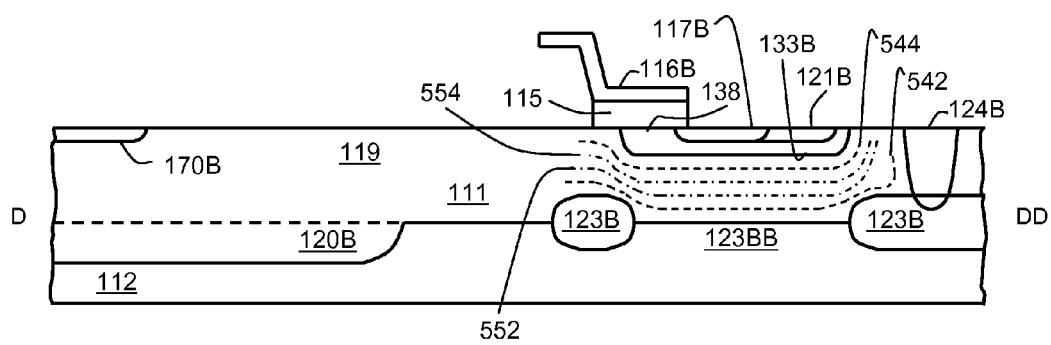

FIGS. 5A-5B are simplified top and cross-sectional views, respectively, showing an exemplary portion of an HV-LC enhancement IGFET 530 in accordance with a second embodiment of the present invention. Many of the elements discussed above in FIGS. 3A-3B are reproduced again in FIGS. 5A-5B and will not be discussed in detail except as described below. In this embodiment buried diffusion region 123B is formed as a lateral annulus 123AA and 123BB generally below the HV-LC enhancement IGFET. The lighter doping in the middle region of annulus 123BB may help prevent excessively high electric fields if higher operating voltages are applied to body region 133B. The higher body operating voltage increases the circuit versatility of this embodiment.

If the voltage on HV diffusion region 170B is below HV, the depletion region from the semiconductor substrate to semiconductor region 111 p-n junction extends slightly above the substrate and into semiconductor region 111 as shown by dashed line 542. Similarly, the depletion region from the body region to semiconductor region 111 p-n junction extends slightly down into semiconductor region 111 as shown by dashed line 544. However, if the voltage on HV diffusion region 170B is raised toward HV, the two depletion regions described above come closer together as shown by dot-dashed lines 552 and 554 respectively. If the depletion regions from the substrate and body meet inside semiconductor region 111, there may be uncontrolled leakage currents from body to substrate called punch-through current. The punch-through current may increase uncontrollably as the voltage on HV diffusion region 170B increases further after the depletion regions meet.

Figure 6A:
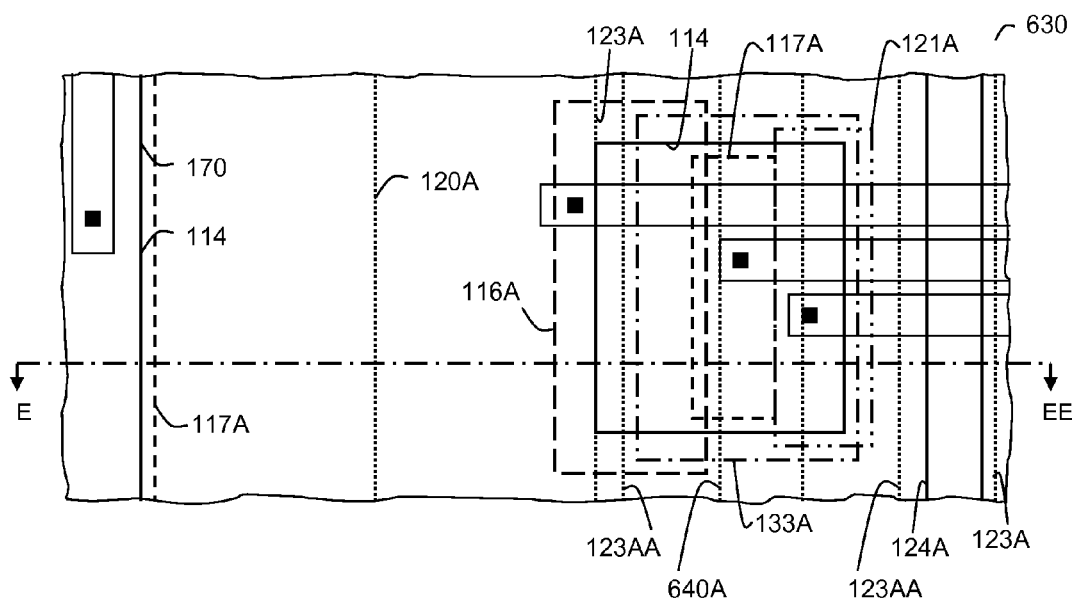
FIGS. 6A-6B are simplified top and cross-sectional views, respectively, showing an exemplary portion of an HV-LC enhancement IGFET in accordance with a third embodiment of the present invention.
Figure 6B:
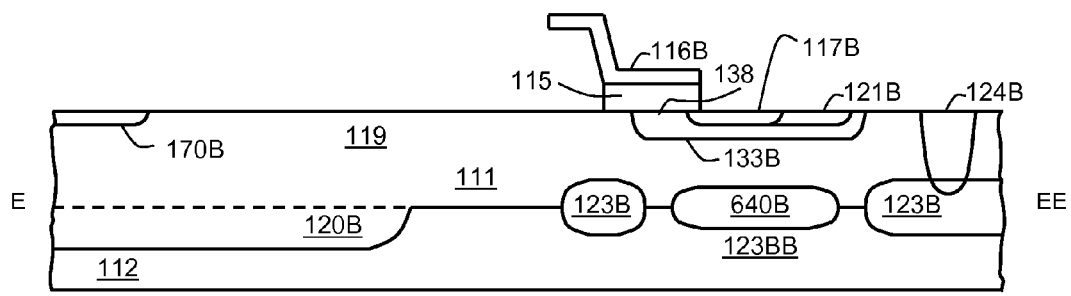

FIGS. 6A-6B are simplified top and cross-sectional views, respectively, showing an exemplary portion of an HV-LC enhancement IGFET 630 in accordance with a third embodiment of the present invention. Many of the elements discussed above in FIGS. 3A-3B are reproduced again in FIGS. 6A-6B and will not be discussed in detail except as described below. In this embodiment a buried diffusion region mask 640A forms a buried diffusion region 640A of the first conductivity type in semiconductor substrate 112 generally below the body of HV-LC enhancement IGFET 630 and inside the annulus 123BB in buried diffusion region 123B. The doping concentration of buried diffusion region 640B is higher than the doping concentration of the similar conductivity type semiconductor region 111. In this embodiment, buried diffusion region 640B is n-type. The higher doping concentration from buried diffusion region 640B may be included to suppress the punch-through current described above and extend the HV range that may be applied to HV diffusion region 170B.

Figure 7:
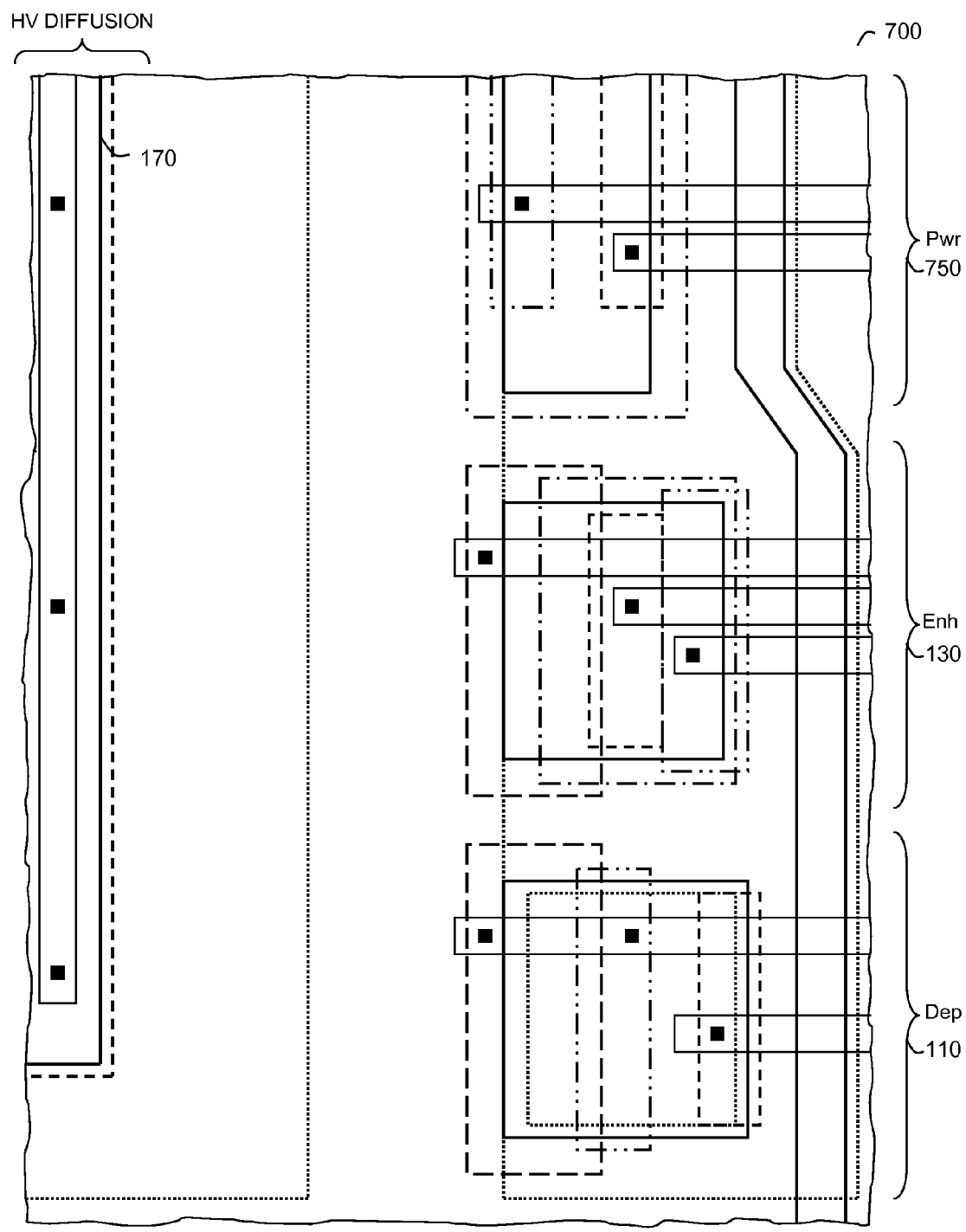
FIG. 7 is a simplified top view showing an exemplary portion of an HV IC having an HV-LC depletion FET, an HV-LC enhancement IGFET, and a bipolar power-transistor in accordance with an embodiment of the present invention.

By way of example, the embodiments have been described in the context of a power IGFET, but it would be recognized that the embodiments have a broader range of applicability. For example, a bipolar transistor or junction FET may be included instead of, or along with, power IGFET 150 described in FIGS. 1, 4A and 4B. FIG. 7 is a simplified top view showing an exemplary portion of an HV IC 700 having HV-LC depletion FET 110, HV-LC enhancement IGFET 130, and a bipolar power-transistor 750 in accordance with an embodiment of the present invention. The example illustrated in FIG. 7 is similar to FIG. 1 except the power transistor may be a bipolar transistor. HV diffusion region 170 is shared in parallel as a collector connection for bipolar power-transistor 750 and as a drain connection for the HV-LC enhancement IGFET and the HV-LC depletion FET, which have been described above.

Figure 8A:
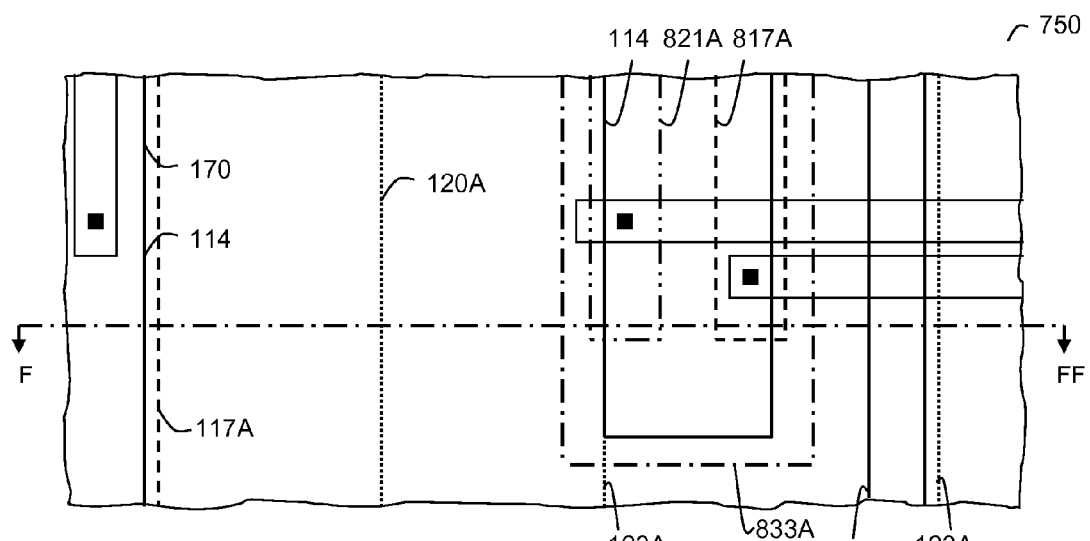
FIGS. 8A-8B are simplified top and cross-sectional views, respectively, showing an exemplary portion of a bipolar power-transistor in accordance with an embodiment of the present invention.
Figure 8B:
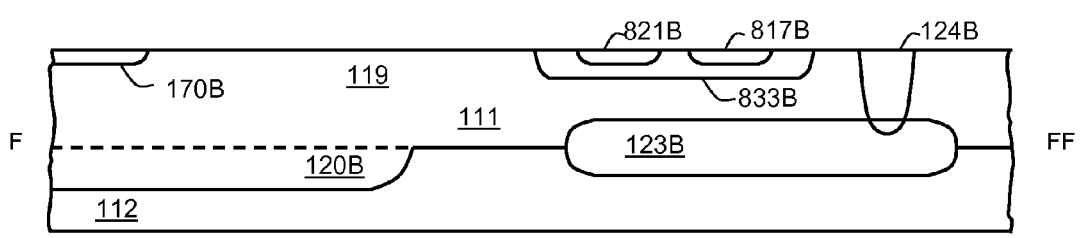

FIGS. 8A-8B are simplified top and cross-sectional views, respectively, showing an exemplary portion of a bipolar power-transistor 750 in accordance with an embodiment of the present invention. FIG. 8A reproduces the power transistor top view as shown in FIG. 7 and includes some mask layers included to form the power bipolar transistor. It would be understood by persons of skill in the art that the bipolar power-transistor may be formed into an HV-LC bipolar transistor by reducing the transistor width on the mask layout (transistor z-dimension) to obtain the desired LC transistor characteristics. Thus, the elements shown in FIGS. 8A-8B may apply to both the bipolar power-transistor and to an HV-LC bipolar transistor. An application example may include HV circuits using HC and LC bipolar transistors with matching beta characteristics.

Many elements shown in FIGS. 8A-8B are the same elements as those shown in FIGS. 3A-3B and will not be described in detail because their structures and operations are similar except as noted below. FIGS. 8A-8B include a base region mask 833A included to form base region 833B of the second conductivity type in the surface of semiconductor region 111. Base region 833B may be analogous to body region 133B of the enhancement IGFET described above or may have different diffusion concentration. Base region 833B forms a p-n junction with semiconductor region 111. A LV diffusion region mask 817A may be included to form a LV diffusion region 817B of the first conductivity type in the surface of base region 833B. LV diffusion region 817B forms a p-n junction with base region 833B, which serves as an emitter connection and may be analogous to LV diffusion region 117B of the IGFET or may have different diffusion concentration. A portion of semiconductor region 111 between base region 833B and HV diffusion region 170B is a drift region. The HV diffusion region is laterally spaced apart from the base region and is configured to receive a high voltage. In this embodiment, base region 833B is p-type and LV diffusion region 817B is n-type. Thus, the bipolar transistor is an npn type.

A LV diffusion region mask 821A may be included to form a LV diffusion region 821B of the second conductivity type in the surface of base region 833B. The doping concentration of LV diffusion region 821B is higher than the doping concentration of the base region 833B to form an ohmic contact to the base region, which is the same conductivity type.

By way of example, the embodiments have been described in the context of the combinations of devices illustrated in FIGS. 1 and 7, but it would be recognized that the embodiments have a broader range of applicability. For example, the HV-LC depletion FET, HV-LC enhancement IGFET, power IGFET, bipolar power-transistor and HV-LC bipolar transistor may be included in any combination that shares some of their HV diffusion connections. The buried layer 123B, isolation diffusion region 124B, and buried diffusion region 640B embodiments described above in reference to FIGS. 2A-6B may also be applied in any combination with any of the combinations of transistors mentioned above.

Figure 9:
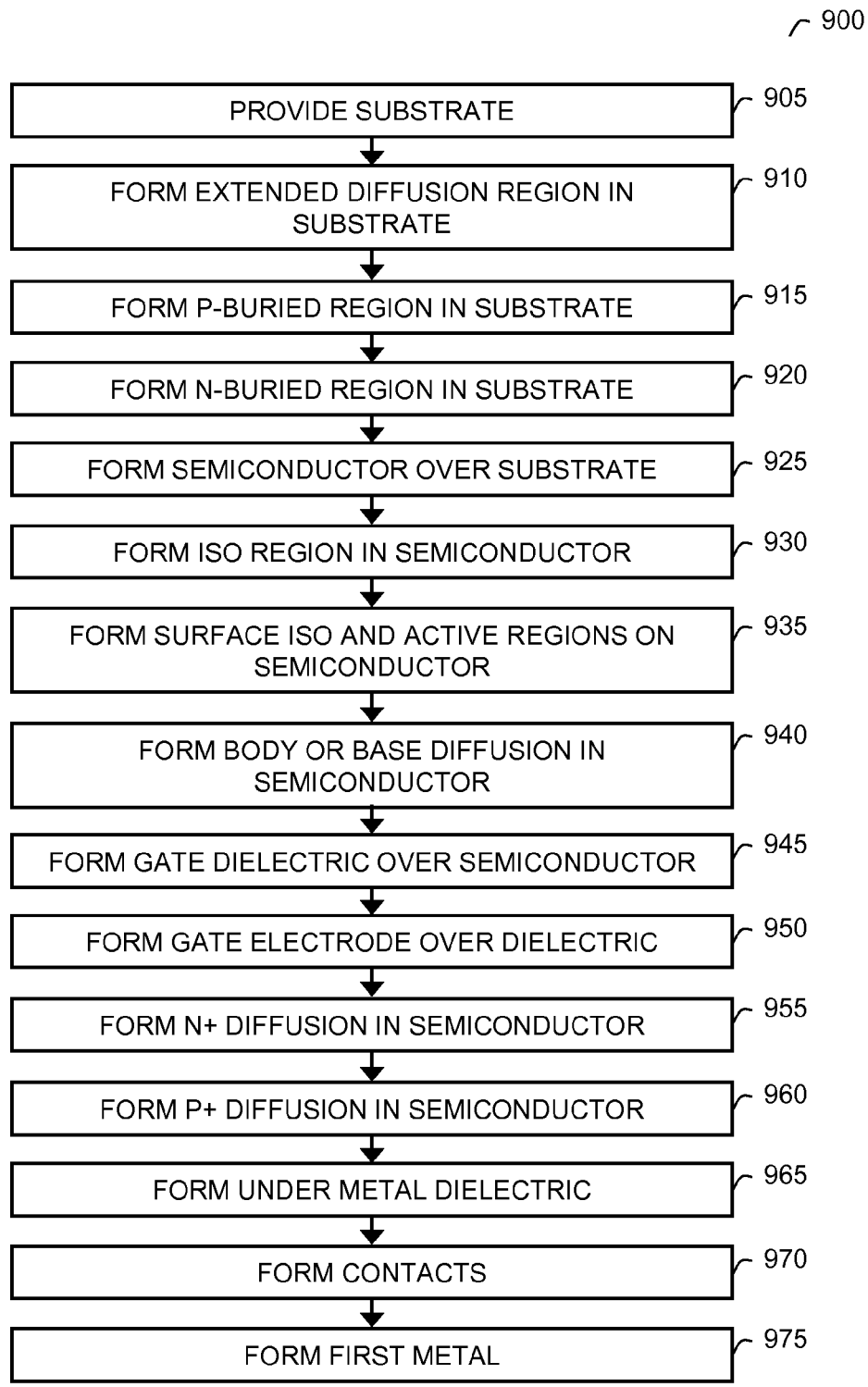
FIG. 9 is a simplified flow chart showing an exemplary method of an HV IC in accordance with one embodiment of the present invention.

FIG. 9 is a simplified flow chart showing an exemplary method 900 of fabricating an HV IC in accordance with one embodiment of the present invention. The method includes the following steps. Substrate 112 of the second conductivity type (p-type in this example) may be provided 905. Extended diffusion region 120B of the first conductivity type (n-type) is formed 910 in the substrate. Buried diffusion region 123B of the second conductivity type is formed 915 in the substrate. Buried diffusion region 640B of the first conductivity type is formed 920 in the substrate. Semiconductor region 111 of the first conductivity type is formed 925 over substrate 112. Isolation diffusion region 124B is formed 930 in semiconductor region 111. Surface isolation and active regions 114 are formed 935 on semiconductor region 111. Body and/or base diffusion 133B and/or 833B, respectively, of the second conductivity type are formed in semiconductor region 111. Gate dielectric 115 is formed 945 over semiconductor region 111. Gate electrode 116B is formed 950 over gate dielectric 115. Forming 955 HV and LV surface diffusion regions 170B and 117B respectively and/or 817B of the first conductivity type in semiconductor region 111. Surface diffusion region 121B and/or 821B of the second conductivity type are formed 960 in semiconductor region 111. A dielectric material is formed 965 over the extant HV IC surface. Contact openings through the dielectric material are formed 970. Conductive material or first metal is formed 975 in the contact openings to form ohmic contacts to surface diffusion regions 170B, 117B, 121B and/or 817B and 821B. Process flow steps 900 may vary and may, in part, be compatible to process foundry flows such as a CMOS or BiCMOS process flows and may not limit the other embodiments described herein.

Embodiments of the present invention provides an apparatus and a method for fabricating HV-HC and HV-LC transistors on a planar, monolithic, integrated circuit. It will be apparent to those with skill in the art that modifications to the above methods and apparatuses may occur without deviating from the scope of the present invention. Accordingly, the disclosures and descriptions herein are intended to be illustrative, but not limiting, of the scope of the invention, which is set forth in the following claims along with their full scope of equivalents.

What is claimed is:

1. A planar, monolithic, high-voltage integrated circuit comprising:
   a semiconductor region of a first conductivity type over a semiconductor substrate of a second conductivity type, the semiconductor region forming a p-n junction with the semiconductor substrate;
   a first diffusion region of the first conductivity type in the semiconductor region, the semiconductor region extending vertically between the first diffusion region and the semiconductor substrate;
   a first field effect transistor (FET) includes:
      a first gate electrode,
      a first gate dielectric between the first gate electrode and the semiconductor region and over the semiconductor region, the first gate dielectric having a first and a second edge,
      a first body region of the second conductivity type in the semiconductor region wherein the first body region:
         overlaps a portion of the first gate dielectric at the first edge of the first gate dielectric,
         forms a p-n junction with the semiconductor region, and
         has an edge under the first gate dielectric, and
      a second diffusion region of the first conductivity type in the first body region and wherein the second diffusion region:
         overlaps a portion of the first gate dielectric at the first edge of the first gate dielectric,
         forms a p-n junction with the first body region, and
         has an edge under the first gate dielectric and, wherein:
      the first gate overlaps the second diffusion region less than the first gate overlaps the first body region,
      the first body region under the first gate dielectric and between the edge of the second diffusion region and the edge of the first body region is a first channel region,
      the first gate dielectric overlaps the semiconductor region at the second edge of the first gate dielectric,
      a portion of the semiconductor region between the first channel region and the first diffusion region is a drift region, and
      the first diffusion region is laterally spaced apart from the first channel region and is configured to receive a high voltage;
   a second FET includes:
      a second gate electrode,
      a second gate dielectric between the second gate electrode and the semiconductor region and over the semiconductor region, the second gate dielectric having a first and a second edge, and
      a third diffusion region of the first conductivity type in the semiconductor region wherein the third diffusion region is proximal to the first edge of the second gate dielectric, and wherein the second gate dielectric:
         is laterally disposed between the first and the third diffusion regions,
         is over a second channel region of the second FET, and
         overlaps the semiconductor region at the second edge of the second gate dielectric and, wherein;

a portion of the semiconductor region between the
second channel region and the first diffusion region
is a drift region, and
the first diffusion region is laterally spaced apart from
the second channel region and is configured to
receive the high voltage.

2. The planar, monolithic, high-voltage integrated circuit of claim 1, wherein the second FET further includes a fourth diffusion region of the second conductivity type in the semiconductor region, and wherein the fourth diffusion region:
forms a p-n junction with the semiconductor region,
overlaps a portion of the second gate dielectric at the first edge of the second gate dielectric, and
is laterally disposed between the second gate dielectric and the third diffusion region, and a portion of the semiconductor region between the fourth diffusion region and the substrate is a third channel region, the fourth diffusion region is laterally spaced apart from the third diffusion region and configured to receive an operating voltage less than the high voltage, and the third channel region of the second FET is adapted to deplete if the operating voltage is applied.

3. The planar, monolithic, high-voltage integrated circuit of claim 2 wherein the fourth diffusion region is electrically coupled to the second gate electrode.

4. The planar, monolithic, high-voltage integrated circuit of claim 1, wherein the second FET further includes a second body region of the second conductivity type in the semiconductor region, and wherein the second body region:
overlaps a portion of the second gate dielectric at the first edge of the second gate dielectric,
forms a p-n junction with the semiconductor region,
and has an edge under the second gate dielectric, and
wherein the third diffusion region is:
in the second body region,
overlaps a portion of the second gate dielectric at the first edge of the second gate dielectric,
forms a p-n junction with the second body region, and
has an edge under the second gate dielectric, and
wherein the second gate dielectric overlap of the third diffusion region is less than the second gate dielectric overlap of the second body region, and the second body region under the second gate dielectric and between the edge of the third diffusion region and the edge of the second body region is the second channel region of the second FET.

5. The planar, monolithic, high-voltage integrated circuit of claim 4, further comprising:
a buried diffusion region of the second conductivity type in the semiconductor substrate, wherein the buried diffusion region forms a p-n junction with the semiconductor region and the doping concentration of the buried diffusion region is higher than the doping concentration of the semiconductor substrate; and
an isolation diffusion region of the second conductivity type in the semiconductor region and extends from a top surface of the semiconductor region into the buried diffusion region wherein the isolation diffusion region forms a p-n junction with the semiconductor region, and the buried diffusion region and the isolation diffusion region form a lateral annulus that isolates the first FET, the second FET and the first diffusion region from other devices on the integrated circuit.

6. The planar, monolithic, high-voltage integrated circuit of claim 5, wherein the isolation diffusion region overlaps the second body region of the second FET.

7. The planar, monolithic, high-voltage integrated circuit of claim 5, wherein the second body region of the second FET is laterally spaced apart from the isolation diffusion region and configured to receive an operating voltage less than high voltage.

8. The planar, monolithic, high-voltage integrated circuit of claim 4, further comprising a buried diffusion region of the first conductivity type in the semiconductor substrate below the second FET, wherein the buried diffusion region forms a p-n junction with the semiconductor substrate, and the doping concentration of the buried diffusion region is higher than the doping concentration of the semiconductor region.

9. The planar, monolithic, high-voltage integrated circuit of claim 1, further comprising an extended diffusion region of a first conductivity type in the semiconductor substrate, the extended diffusion region forming a p-n junction with the semiconductor substrate and having a lateral extent wider than a lateral extent of the first diffusion region.

10. The planar, monolithic, high-voltage integrated circuit of claim 1, further comprising:
a buried diffusion region of the second conductivity type in the semiconductor substrate, wherein the buried diffusion region forms a p-n junction with the semiconductor region, and the doping concentration of the buried diffusion region is higher than the doping concentration of the semiconductor substrate;
an isolation diffusion region of the second conductivity type in the semiconductor region and extends from a top surface of the semiconductor region into the buried diffusion region wherein the isolation diffusion region forms a p-n junction with the semiconductor region, and the buried diffusion region and the isolation diffusion region form a lateral annulus that isolates the first FET, the second FET and the first diffusion region from other devices on the integrated circuit.

11. The planar, monolithic, high-voltage integrated circuit of claim 10, wherein the isolation diffusion region overlaps the first body region of the first FET.

12. The planar, monolithic, high-voltage integrated circuit of claim 10, wherein the first body region of the first FET is laterally spaced apart from the isolation diffusion region and configured to receive an operating voltage less than the high voltage.

13. The planar, monolithic, high-voltage integrated circuit of claim 10, wherein the buried diffusion region forms a lateral annulus below the second FET.

14. A method of forming a planar, monolithic, high-voltage integrated circuit to save area on a die comprising the steps of:
forming a semiconductor region of a first conductivity type over a semiconductor substrate of a second conductivity type, the semiconductor region forming a p-n junction with the semiconductor substrate;
forming a first diffusion region of the first conductivity type in the semiconductor region, the semiconductor region extending vertically between the first diffusion region and the semiconductor substrate;
forming a first FET including:
forming a first gate electrode,
forming a first gate dielectric between the first gate electrode and the semiconductor region and over the semiconductor region, the first gate dielectric having a first and a second edge,
forming a first body region of the second conductivity type in the semiconductor region wherein the first body region:
overlaps a portion of the first gate dielectric at the first edge of the first gate dielectric, forms a p-n junction with the semiconductor region, and has an edge under the first gate dielectric; and forming a second diffusion region of the first conductivity type in the first body region, wherein the second diffusion region:
: overlaps a portion of the first gate dielectric at the first edge of the first gate dielectric,
forms a p-n junction with the first body region and
has an edge under the first gate dielectric and, wherein:
the first gate overlaps the second diffusion region less than the first gate overlaps the first body region,
the first body region under the first gate dielectric and between the edge of the second diffusion region and the edge of the first body region is a first channel region,
the first gate dielectric overlaps the semiconductor region at the second edge of the first gate dielectric,
a portion of the semiconductor region between the first channel region and the first diffusion region is a drift region, and
the first diffusion region is laterally spaced apart from the first channel region and is configured to receive a high voltage;

forming a second FET including:
: forming a second gate electrode,
forming a second gate dielectric between the second gate electrode and the semiconductor region and over the semiconductor region, the second gate dielectric having a first and a second edge, and
forming a third diffusion region of the first conductivity type in the semiconductor region wherein the third diffusion region is proximal to the first edge of the second gate dielectric, and wherein the second gate dielectric:
: is laterally disposed between the first and the third diffusion regions,
is over a second channel region of the second FET, and
overlaps the semiconductor region at the second edge of the second gate dielectric, and wherein a portion of the semiconductor region between the second channel region and the first diffusion region is a drift region, and the first diffusion region is laterally spaced apart from the second channel region and is configured to receive the high voltage.

15. The method of claim 14, wherein the steps of forming the second FET further include forming a fourth diffusion region of the second conductivity type in the semiconductor region, and wherein the fourth diffusion region:
forms a p-n junction with the semiconductor region,
overlaps a portion of the second gate dielectric at the first edge of the second gate dielectric, and
is laterally disposed between the second gate dielectric and the third diffusion region, wherein:
a portion of the semiconductor region between the fourth diffusion region and the substrate is a third channel region,
the fourth diffusion region is laterally spaced apart from the third diffusion region and configured to receive an operating voltage less than the high voltage, and
the third channel region of the second FET is adapted to deplete if the operating voltage is applied.

16. The method of claim 15, further comprising coupling the fourth diffusion region electrically to the second gate electrode.

17. The method of claim 14, wherein the steps of forming the second FET further include forming a second body region of the second conductivity type in the semiconductor region, and wherein the second body region:
overlaps a portion of the second gate dielectric at the first edge of the second gate dielectric,
forms a p-n junction with the semiconductor region,
and has an edge under the second gate dielectric, and
wherein the third diffusion region is:
in the second body region,
overlaps a portion of the second gate dielectric at the first edge of the second gate dielectric,
forms a p-n junction with the second body region, and
has an edge under the second gate dielectric, and wherein:
the second gate dielectric overlap of the third diffusion region is less than the second gate dielectric overlap of the second body region, and
the second body region under the second gate dielectric and between the edge of the third diffusion region and the edge of the second body region is the second channel region of the second FET.

18. The method of claim 17, further comprising:
forming a buried diffusion region of the second conductivity type in the semiconductor substrate, wherein the buried diffusion region forms a p-n junction with the semiconductor region and the doping concentration of the buried diffusion region is higher than the doping concentration of the semiconductor substrate;
forming an isolation diffusion region of the second conductivity type in the semiconductor region and extending from a top surface of the semiconductor region into the buried diffusion region, wherein the isolation diffusion region forms a p-n junction with the semiconductor region, and the buried diffusion region and the isolation diffusion region form a lateral annulus that isolates the first FET, the second FET and the first diffusion region from other devices on the integrated circuit.

19. The method of claim 18, further comprising overlapping the isolation diffusion region with the second body region of the second FET.

20. The method of claim 18, further comprising forming the second body region of the second FET to be laterally spaced apart from the isolation diffusion region and configured to receive an operating voltage less than the high voltage.

21. The method of claim 17, further comprising forming a buried diffusion region of the first conductivity type in the semiconductor substrate below the second FET, wherein the buried diffusion region forms a p-n junction with the semiconductor substrate, and the doping concentration of the buried diffusion region is higher than the doping concentration of the semiconductor region.

22. The method of claim 14, further comprising forming an extended diffusion region of the first conductivity type in the semiconductor substrate, the extended diffusion region forming a p-n junction with the semiconductor substrate and having a lateral extent wider than a lateral extent of the first diffusion region.

23. The method of claim 14, further comprising:
forming a buried diffusion region of the second conductivity type in the semiconductor substrate, wherein the buried diffusion region forms a p-n junction with the semiconductor region and the doping concentration of the buried diffusion region is higher than the doping concentration of the semiconductor substrate;
forming an isolation diffusion region of the second conductivity type in the semiconductor region and extending from a top surface of the semiconductor region into the buried diffusion region, wherein the isolation diffusion region forms a p-n junction with the semiconductor region, and the buried diffusion region and the isolation diffusion region form a lateral annulus that isolates the first FET, the second FET and the first diffusion region from other devices on the integrated circuit.

24. The method of claim 23, further comprising forming the isolation diffusion region to overlap the first body region of the first FET.

25. The method of claim 23 further comprising forming the first body region of the first FET to be laterally spaced apart from the isolation diffusion region and configured to receive an operating voltage less than the high voltage.

26. The method of claim 23, further comprising forming the buried diffusion region as a lateral annulus below the second FET.

27. A planar, monolithic, high-voltage integrated circuit comprising:
  a semiconductor region of a first conductivity type over a semiconductor substrate of a second conductivity type, the semiconductor region forming a p-n junction with the semiconductor substrate;
  a first diffusion region of the first conductivity type in the semiconductor region, the semiconductor region extending vertically between the first diffusion region and the semiconductor substrate;
  a bipolar transistor includes:
    a base region of the second conductivity type in the semiconductor region wherein the base region:
      forms a p-n junction with the semiconductor region, and
    a second diffusion region of the first conductivity type in the base region and wherein the second diffusion region:
      forms a p-n junction with the base region, and,
    wherein a portion of the semiconductor region between the base region and the first diffusion region is a drift region, and the first diffusion region is laterally spaced apart from the base region and is configured to receive a high voltage;
  a FET includes:
    a gate electrode,
    a gate dielectric between the gate electrode and the semiconductor region and over the semiconductor region, the gate dielectric having a first and a second edge, and
    a third diffusion region of the first conductivity type in the semiconductor region wherein the third diffusion region is proximal to the first edge of the gate dielectric, and wherein the gate dielectric:
      is laterally disposed between the first and the third diffusion regions,
      is over a first channel region of the FET, and
      overlaps the semiconductor region at the second edge of the gate dielectric, and
    wherein a portion of the semiconductor region between the first channel region and the first diffusion region is a drift region, and the first diffusion region is laterally spaced apart from the first channel region and is configured to receive the high voltage.

28. The planar, monolithic, high-voltage integrated circuit of claim 27, wherein the FET further includes a fourth diffusion region of the second conductivity type in the semiconductor region, and wherein the fourth diffusion region:
  forms a p-n junction with the semiconductor region,
  overlaps a portion of the gate dielectric at the first edge of the gate dielectric, and
  is laterally disposed between the gate dielectric and the third diffusion region, wherein:
    a portion of the semiconductor region between the fourth diffusion region and the substrate is a second channel region,
    the fourth diffusion region is laterally spaced apart from the third diffusion region and configured to receive an operating voltage less than the high voltage, and
    the second channel region of the FET is adapted to deplete if the operating voltage is applied.

29. The planar, monolithic, high-voltage integrated circuit of claim 28, wherein the fourth diffusion region is electrically coupled to the gate electrode.

30. The planar, monolithic, high-voltage integrated circuit of claim 27, wherein the FET further includes a second body region of the second conductivity type in the semiconductor region, and wherein the second body region:
  overlaps a portion of the gate dielectric at the first edge of the gate dielectric,
  forms a p-n junction with the semiconductor region, and
  has an edge under the gate dielectric, and
  wherein the third diffusion region is:
    in the second body region,
    overlaps a portion of the gate dielectric at the first edge of the gate dielectric,
    forms a p-n junction with the second body region, and
    has an edge under the gate dielectric, and
  wherein the gate dielectric overlap of the third diffusion region is less than the gate dielectric overlap of the second body region, and the second body region under the gate dielectric and between the edge of the third diffusion region and the edge of the second body region is the first channel region of the FET.

31. The planar, monolithic, high-voltage integrated circuit of claim 30, further comprising:
  a buried diffusion region of the second conductivity type in the semiconductor substrate, wherein the buried diffusion region forms a p-n junction with the semiconductor region and the doping concentration of the buried diffusion region is higher than the doping concentration of the semiconductor substrate;
  an isolation diffusion region of the second conductivity type in the semiconductor region and extends from a top surface of the semiconductor region into the buried diffusion region wherein the isolation diffusion region forms a p-n junction with the semiconductor region, and the buried diffusion region and the isolation diffusion region form a lateral annulus that isolates the bipolar transistor, the FET, and the first diffusion region from other devices on the integrated circuit.

32. The planar, monolithic, high-voltage integrated circuit of claim 31, wherein the isolation diffusion region overlaps the second body region of the FET.

33. The planar, monolithic, high-voltage integrated circuit of claim 31, wherein the second body region of the FET is laterally spaced apart from the isolation diffusion region and configured to receive an operating voltage less than the high voltage.

34. The planar, monolithic, high-voltage integrated circuit of claim 30, further comprising a buried diffusion region of the first conductivity type in the semiconductor substrate and below the FET, wherein the buried diffusion region forms a p-n junction with the semiconductor substrate, and the doping concentration of the buried diffusion region is higher than the doping concentration of the semiconductor region.

35. The planar, monolithic, high-voltage integrated circuit of claim 27, further comprising an extended diffusion region of a first conductivity type in the semiconductor substrate, the extended diffusion region forming a p-n junction with the semiconductor substrate and having a lateral extent wider than a lateral extent of the first diffusion region.

36. The planar, monolithic, high-voltage integrated circuit of claim 27, further comprising:
   a buried diffusion region of the second conductivity type in the semiconductor substrate, wherein the buried diffusion region forms a p-n junction with the semiconductor region and the doping concentration of the buried diffusion region is higher than the doping concentration of the semiconductor substrate;
   an isolation diffusion region of the second conductivity type in the semiconductor region and extends from a top surface of the semiconductor region into the buried diffusion region wherein the isolation diffusion region forms a p-n junction with the semiconductor region, and the buried diffusion region and the isolation diffusion region form a lateral annulus that isolates the bipolar transistor, the FET, and the first diffusion region from other devices on the integrated circuit.

37. The planar, monolithic, high-voltage integrated circuit of claim 36, wherein the isolation diffusion region overlaps the base region of the bipolar transistor.

38. The planar, monolithic, high-voltage integrated circuit of claim 36, wherein the base region of the bipolar transistor is laterally spaced apart from the isolation diffusion region and configured to receive an operating voltage less than the high voltage.

39. The planar, monolithic, high-voltage integrated circuit of claim 36, wherein the buried diffusion region forms a lateral annulus below the FET.

40. A method of forming a planar, monolithic, high-voltage integrated circuit to save area on a die comprising the steps of:
   forming a semiconductor region of a first conductivity type over a semiconductor substrate of a second conductivity type, the semiconductor region forming a p-n junction with the semiconductor substrate;
   forming a first diffusion region of the first conductivity type in the semiconductor region, the semiconductor region extending vertically between the first diffusion region and the semiconductor substrate;
   forming a bipolar transistor including:
      forming a base region of the second conductivity type in the semiconductor region wherein the base region:
         forms a p-n junction with the semiconductor region, and
      forming a second diffusion region of the first conductivity type in the base region and wherein the second diffusion region:
         forms a p-n junction with the base region, and,
      wherein a portion of the semiconductor region between the base region and the first diffusion region is a drift region, and the first diffusion region is laterally spaced apart from the base region and is configured to receive a high voltage;
   forming a FET including:
      forming a gate electrode,
      forming a gate dielectric between the gate electrode and the semiconductor region and over the semiconductor region, the gate dielectric having a first and a second edge, and
      forming a third diffusion region of the first conductivity type in the semiconductor region wherein the third diffusion region is proximal to the first edge of the gate dielectric, and wherein the gate dielectric:
         is laterally disposed between the first and the third diffusion regions,
         is over a first channel region of the FET, and
         overlaps the semiconductor region at the second edge of the gate dielectric, and
      wherein a portion of the semiconductor region between the first channel region and the first diffusion region is a drift region, and the first diffusion region is laterally spaced apart from the first channel region and is configured to receive the high voltage.

41. The method of claim 40, wherein the steps of forming the FET further include forming a fourth diffusion region of the second conductivity type in the semiconductor region, and wherein the fourth diffusion region:
   forms a p-n junction with the semiconductor region,
   overlaps a portion of the gate dielectric at the first edge of the gate dielectric, and
   is laterally disposed between the gate dielectric and the third diffusion region, wherein:
      a portion of the semiconductor region between the fourth diffusion region and the substrate is a second channel region,
      the fourth diffusion region is laterally spaced apart from the third diffusion region and configured to receive an operating voltage less than the high voltage, and
      the second channel region of the FET is adapted to deplete if the operating voltage is applied.

42. The method of claim 41, further comprising coupling the fourth diffusion region electrically to the gate electrode.

43. The method of claim 40, wherein the steps of forming the FET further including forming a second body region of the second conductivity type in the semiconductor region, and wherein the second body region:
   overlaps a portion of the gate dielectric at the first edge of the gate dielectric,
   forms a p-n junction with the semiconductor region, and
   has an edge under the gate dielectric, and
   wherein the third diffusion region is:
      in the second body region,
      overlaps a portion of the gate dielectric at the first edge of the gate dielectric,
      forms a p-n junction with the second body region, and
      has an edge under the gate dielectric, and
   wherein the gate dielectric overlap of the third diffusion region is less than the gate dielectric overlap of the second body region, and the second body region under the gate dielectric and between the edge of the third diffusion region and the edge of the second body region is the first channel region of the FET.

44. The method of claim 43, further comprising:
   forming a buried diffusion region of the second conductivity type in the semiconductor substrate, wherein the buried diffusion region forms a p-n junction with the semiconductor region and the doping concentration of the buried diffusion region is higher than the doping concentration of the semiconductor substrate;
   forming an isolation diffusion region of the second conductivity type in the semiconductor region and extending from a top surface of the semiconductor region into the buried diffusion region wherein the isolation diffusion region forms a p-n junction with the semiconductor region, and the buried diffusion region and the isolation diffusion region form a lateral annulus that isolates the bipolar transistor, the FET, and the first diffusion region from other devices on the integrated circuit.

45. The method of claim 44, further comprising overlapping the isolation diffusion region with the second body region of the FET.

46. The method of claim 44, further comprising forming the second body region of the FET to be laterally spaced apart from the isolation diffusion region and configured to receive an operating voltage less than the high voltage.

47. The method of claim 43, further comprising forming a buried diffusion region of the first conductivity type in the semiconductor substrate and below the FET, wherein the buried diffusion region forms a p-n junction with the semiconductor substrate, and the doping concentration of the buried diffusion region is higher than the doping concentration of the semiconductor region.

48. The method of claim 40, further comprising forming an extended diffusion region of the first conductivity type in the semiconductor substrate, the extended diffusion region forming a p-n junction with the semiconductor substrate and having a lateral extent wider than a lateral extent of the first diffusion region.

49. The method of claim 40, further comprising:
forming a buried diffusion region of the second conductivity type in the semiconductor substrate, wherein the buried diffusion region forms a p-n junction with the semiconductor region and the doping concentration of the buried diffusion region is higher than the doping concentration of the semiconductor substrate;
forming an isolation diffusion region of the second conductivity type in the semiconductor region and extending from a top surface of the semiconductor region into the buried diffusion region wherein the isolation diffusion region forms a p-n junction with the semiconductor region, and the buried diffusion region and the isolation diffusion region form a lateral annulus that isolates the bipolar transistor, the FET, and the first diffusion region from other devices on the integrated circuit.

50. The method of claim 49, further comprising forming the isolation diffusion region to overlap the base region of the bipolar transistor.

51. The method of claim 49, further comprising forming the base region of the bipolar transistor to be laterally spaced apart from the isolation diffusion region and configured to receive an operating voltage less than the high voltage.

52. The method of claim 49, further comprising forming the buried diffusion region as a lateral annulus below the FET.

* * * * *